(12) United States Patent
Ikeda et al.

(10) Patent No.: US 12,362,151 B2
(45) Date of Patent: Jul. 15, 2025

(54) PLASMA PROCESSING APPARATUS AND PLASMA PROCESSING METHOD

(71) Applicant: Tokyo Electron Limited, Tokyo (JP)

(72) Inventors: Taro Ikeda, Nirasaki (JP); Toshifumi Kitahara, Fuchu (JP); Satoru Kawakami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 303 days.

(21) Appl. No.: 17/756,681

(22) PCT Filed: Nov. 24, 2020

(86) PCT No.: PCT/JP2020/043657
§ 371 (c)(1),
(2) Date: May 31, 2022

(87) PCT Pub. No.: WO2021/111926
PCT Pub. Date: Jun. 10, 2021

(65) Prior Publication Data
US 2023/0005720 A1 Jan. 5, 2023

(30) Foreign Application Priority Data
Dec. 5, 2019 (JP) .................... 2019-220668

(51) Int. Cl.
*H01J 37/32* (2006.01)
*C23C 16/509* (2006.01)

(52) U.S. Cl.
CPC ...... *H01J 37/32541* (2013.01); *C23C 16/509* (2013.01); *H01J 37/32082* (2013.01); *H01J 2237/3321* (2013.01)

(58) Field of Classification Search
CPC .......... H01J 37/32541; H01J 37/32082; H01J 2237/3321; H01J 37/3255; H01J 2237/334; C23C 16/509; C23C 16/345; H01L 21/3065; H01L 21/31; H05H 1/46
USPC ................................................. 118/715, 723
See application file for complete search history.

(56) References Cited

U.S. PATENT DOCUMENTS

| | | | | |
|---|---|---|---|---|
| 5,690,781 A | * | 11/1997 | Yoshida | ............ H01J 37/32458 216/68 |
| 6,203,620 B1 | * | 3/2001 | Moslehi | ................ H01J 37/321 156/345.35 |
| 6,286,454 B1 | * | 9/2001 | Hirayama | ......... C23C 16/45565 118/723 MW |

(Continued)

FOREIGN PATENT DOCUMENTS

| | | |
|---|---|---|
| JP | 2000-323456 A | 11/2000 |
| JP | 2005-100931 A | 4/2005 |

(Continued)

*Primary Examiner* — Jeffrie R Lund
(74) *Attorney, Agent, or Firm* — Armstrong Teasdale LLP

(57) ABSTRACT

A plasma processing apparatus includes a stage provided in a processing container, and an upper electrode. The upper electrode includes a dielectric plate facing the stage, and a conductor formed on a surface of the dielectric plate opposite to a surface of the dielectric plate facing the stage. The dielectric plate includes a central portion, an outer peripheral portion, and an intermediate portion between the central portion and the outer peripheral portion. The intermediate portion has a thickness larger than the thicknesses of the central portion and the outer peripheral portion.

15 Claims, 5 Drawing Sheets

(56) References Cited

U.S. PATENT DOCUMENTS

| | | | |
|---|---|---|---|
| 11,923,170 B2 * | 3/2024 | Kawakami | H01J 37/32568 |
| 2005/0066898 A1 * | 3/2005 | Schmitt | H01J 37/32541 |
| | | | 118/723 E |
| 2007/0113788 A1 * | 5/2007 | Nozawa | H01J 37/32192 |
| | | | 118/723 MW |
| 2009/0215274 A1 * | 8/2009 | Matsumoto | H01J 37/32568 |
| | | | 438/758 |
| 2010/0048003 A1 * | 2/2010 | Sung | H01J 37/32091 |
| | | | 156/345.43 |
| 2011/0039417 A1 * | 2/2011 | Matsumoto | H05H 1/46 |
| | | | 438/758 |
| 2015/0068682 A1 * | 3/2015 | Banna | H01J 37/3211 |
| | | | 156/345.48 |
| 2023/0005720 A1 * | 1/2023 | Ikeda | C23C 16/345 |

FOREIGN PATENT DOCUMENTS

| | | | | |
|---|---|---|---|---|
| JP | 2012-256604 A | | 12/2012 | |
| JP | 2016-534522 A | | 11/2016 | |
| TW | 200419672 A | * | 10/2004 | H01L 21/02046 |
| TW | 201207931 A | * | 2/2012 | H01J 23/36 |
| TW | I415526 B | * | 11/2013 | |
| WO | WO-2010004836 A1 | * | 1/2010 | H01J 37/32192 |

* cited by examiner

PLASMA PROCESSING APPARATUS AND PLASMA PROCESSING METHOD

CROSS-REFERENCE TO RELATED APPLICATIONS

The present application is a U.S. National Stage Entry of International Patent Application No. PCT/JP2020/043657, filed Nov. 24, 2020, which claims the benefit of priority to Japanese Patent Application No. 2019-220668, filed Dec. 5, 2019, each of which is hereby incorporated herein by reference in its entirety.

TECHNICAL FIELD

The present disclosure relates to a plasma processing apparatus and a plasma processing method.

BACKGROUND

For example, Patent Document 1 proposes a configuration in which radio-frequency plasma is generated in a plasma process space formed between two electrode surfaces facing each other in a vacuum container, one electrode surface is made of a dielectric material, and the thickness of the dielectric material is smaller in the peripheral region than in the central region.

In addition, for example, Patent Document 2 proposes a configuration in which an electrode plate in which an upper electrode and a lower electrode face each other is provided, and the electrode plate includes an outer portion formed of a conductor or a semiconductor and an intermediate portion formed of a dielectric member or a high resistance member having a higher resistance than the outer portion. Radio-frequency power is applied to the upper electrode from a surface opposite to the lower electrode.

PRIOR ART DOCUMENTS

Patent Documents

Patent Document 1: Japanese Laid-Open Patent Publication No. 2012-256604
Patent Document 2: Japanese Laid-Open Patent Publication No. 2000-323456

The present disclosure provides a plasma processing apparatus and a plasma processing method capable of improving in-plane uniformity of plasma density.

SUMMARY

According to an aspect of the present disclosure, there is provided a plasma processing apparatus including a stage provided in a processing container, and an upper electrode. The upper electrode includes a dielectric plate facing the stage, and a conductor formed on a surface of the dielectric plate opposite to a surface of the dielectric plate facing the stage. The dielectric plate includes a central portion, an outer peripheral portion, and an intermediate portion between the central portion and the outer peripheral portion. The intermediate portion has a thickness larger than the thicknesses of the central portion and the outer peripheral portion.

According to an aspect, it is possible to improve in-plane uniformity of plasma density.

DETAILED DESCRIPTION

Figure 1:
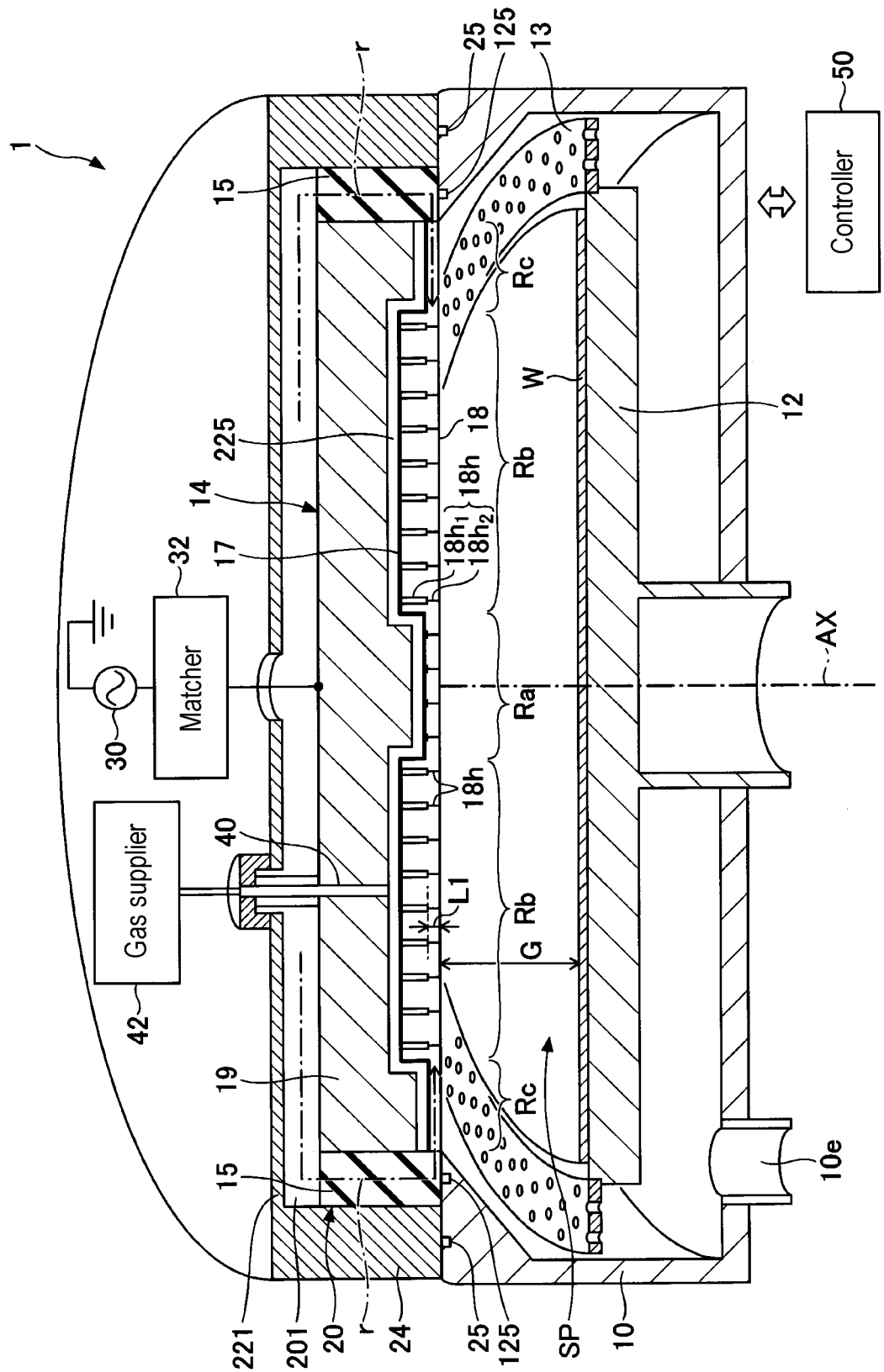
FIG. 1 is a schematic cross-sectional view illustrating a plasma processing apparatus according to an embodiment.

Hereinafter, embodiments of the present disclosure will be described with reference to the accompanying drawings. In each of the drawings, the same components are denoted by the same reference numerals, and redundant descriptions may be omitted.

[Plasma Processing Apparatus]

First, a plasma processing apparatus 1 according to an embodiment will be described with reference to FIG. 1. FIG. 1 is a schematic cross-sectional view illustrating the plasma processing apparatus 1 according to the embodiment. The plasma processing apparatus 1 illustrated in FIG. 1 includes a processing container 10, a stage 12, an upper electrode 14, and a waveguide part 20.

The processing container 10 has a substantially cylindrical shape and extends along the vertical direction. The central axis of the processing container 10 is an axis AX extending in the vertical direction. The processing container 10 is formed of a conductor such as aluminum or an aluminum alloy. A corrosion-resistant film is formed on the surface of the processing container 10. The corrosion-resistant film is formed of ceramic such as aluminum oxide or yttrium oxide. The processing container 10 is grounded.

The stage 12 is provided in the processing container 10. The stage 12 is configured to support a substrate W placed on the top surface thereof substantially horizontally. The stage 12 has a substantially disk-like shape. The central axis of the stage 12 substantially coincides with the axis AX.

The plasma processing apparatus 1 may further include a baffle member 13. The baffle member 13 extends between the stage 12 and the side wall of the processing container 10. The baffle member 13 is a substantially annular plate material. The baffle member 13 is formed of an insulator such as an aluminum oxide. A plurality of through holes are formed in the baffle member 13. The plurality of through holes penetrate the baffle member 13 in the plate thickness direction of the same. An exhaust port 10e is provided in the processing container 10 below the stage 12. An exhaust apparatus is connected to the exhaust port 10e. The exhaust apparatus includes a pressure control valve and a vacuum pump such as a turbo molecular pump and/or a dry pump. The interior of the processing container 10 is evacuated by the exhaust apparatus.

The upper electrode 14 is provided above the stage 12 via a plasma processing space (hereinafter, referred to as a "space SP") in the processing container 10. The central axis of the upper electrode 14 substantially coincides with the axis AX. The upper electrode 14 has a substantially disk-like shape. The upper electrode 14 includes a dielectric plate 18 and a conductor 17. The stage 12 and the dielectric plate 18 face each other, and plasma is generated in the space SP between the stage 12 and the dielectric plate 18.

The dielectric plate 18 is formed of, for example, ceramic and transmits radio-frequency waves (electromagnetic waves). The bottom surface of the dielectric plate 18 is exposed to the space SP, and the electromagnetic waves transmitted through the dielectric plate 18 are radiated to the space SP. The conductor 17 is formed on the opposite surface to the surface of the dielectric plate 18 exposed to the space SP. The conductor 17 may be formed of a metal mesh or a metal film. The material of the conductor 17 may be tungsten or molybdenum, or may be another conductive material. The upper electrode 14 further includes a base 19, and the base 19 is provided on the opposite side to the dielectric plate 18 with the conductor 17 interposed therebetween. The base 19 may be a metal such as aluminum. However, the base 19 is not limited to a metal, and may be formed of other materials. Further, when the conductor 17 is not provided, the contact surface of the base 19 with the dielectric plate 18 may be treated as the conductor 17. The central axis of the upper electrode 14 substantially coincides with the axis AX.

The cylindrical member 24 has a substantially cylindrical shape with an upper wall and is formed of a conductor such as aluminum or an aluminum alloy. The central axis of the cylindrical member 24 substantially coincides with the axis AX. The cylindrical member 24 extends in the vertical direction. The lower end surface of the cylindrical member 24 comes into contact with the upper end surface of the processing container 10. The processing container 10 is grounded. Therefore, the cylindrical member 24 is grounded. At the upper end of the cylindrical member 24, an upper wall portion 221 forming a waveguide passage r together with the top surface of the base 19 is located.

The plasma processing apparatus 1 includes a waveguide part 20 (a waveguide passage r) in order to supply radio-frequency waves to the space SP. The waveguide part 20 includes a waveguide 15 outside the peripheral edge of the upper electrode 14. The waveguide 15 is a portion through which the radio-frequency waves are introduced into the space SP. The radio-frequency waves are VHF waves. The waveguide 15 is provided at a lateral end of the space SP.

The waveguide 15 is a cylindrical member extending along the vertical direction. The central axis of the waveguide 15 substantially coincides with the axis AX. The waveguide 15 is formed of a dielectric such as quartz or Teflon (registered trademark). The waveguide 15 may be a space. The waveguide part 20 further includes a waveguide 201. The waveguide 201 is provided by the space between the top surface of the upper electrode 14 and the upper wall surface of the cylindrical member 24, which may be formed of a conductor such as aluminum or an aluminum alloy.

A radio-frequency power supply 30 is electrically connected to the top surface of the upper electrode 14 constituting the inner wall of the waveguide part 20 via a matcher 32. The radio-frequency power supply 30 is a power supply that generates radio-frequency waves. The matcher 32 includes a matching circuit configured to match the load-side impedance when seen from the radio-frequency power supply 30 with the output impedance of the radio-frequency power supply 30.

In the plasma processing apparatus 1, radio-frequency waves are propagated from the radio-frequency power supply 30 to the outer peripheral side of the dielectric plate 18 via the waveguide 201 and the waveguide 15 of the waveguide part 20, and are transmitted through the dielectric plate 18 to be supplied to the space SP from the bottom surface of the dielectric plate 18. The radio-frequency waves are not limited to VHF waves, but may be UHF waves.

A sealing member 25 is interposed between the bottom surface of the cylindrical member 24 and the upper end surface of the main body of the processing container 10. A sealing member 125 is interposed between the bottom surface of the waveguide 15 and the upper end surface of the main body of the processing container 10. Each of the sealing member 25 and the sealing member 125 has elasticity and is, for example, a rubber O-ring. Each of the sealing member 25 and the sealing member 125 extends circumferentially around the axis AX. The bottom surface of the waveguide 15 may be open to the space SP without being covered with the upper end surface of the main body of the processing container 10. In this case, an inclined surface of the processing container 10 near the bottom surface of the waveguide 15 is cut to a position which allows the lower end of the waveguide 15 to be exposed to the processing space SP, and the sealing member 125 may not be disposed.

A space 225 for gas diffusion is defined between the bottom surface of the base 19 and the dielectric plate 18 (and the conductor 17). A pipe 40 is connected to the space 225. A gas supplier 42 is connected to the pipe 40. The gas supplier 42 includes one or more gas sources used for processing a substrate W. In addition, the gas supplier 42 includes one or more flow rate controllers configured to control the flow rates of gases from the one or more gas sources, respectively.

The pipe 40 extends to the space 225. The waveguide 201 provided by the waveguide part 20 is configured with a grounded conductor. Therefore, the excitation of gas within the pipe 40 is suppressed. The gas supplied to the space 225 is ejected to the space SP through the plurality of gas ejection holes 18h in the dielectric plate 18.

The thickness of the dielectric plate 18 is in an approximately inverted-W shape (the outer peripheral portion is thin, the intermediate portion is thick, and the central portion is thin). This makes it possible to form electric fields by radio-frequency waves uniformly in the space SP. The radio-frequency electric fields formed in the space SP excite the gas in the space SP, and plasma is generated from the gas. As a result, the plasma is generated with a uniform density distribution in the space SP. The substrate W on the stage 12 is processed with a chemical species from the plasma.

The stage 12 is provided with a conductive layer for an electrostatic chuck and a conductive layer for a heater. The stage 12 includes a main body, the conductive layer for the electrostatic chuck, and the conductive layer for the heater. The stage 12 may be a conductor such as aluminum for functioning as a lower electrode, but as an example, the stage is formed of an insulator such as aluminum nitride. The stage 12 has a substantially disk-like shape. The conductive layer of the stage is made of a conductive material such as tungsten. The conductive layer is provided in the main body. When a DC voltage from a DC power supply is applied to the conductive layer for the electrostatic chuck, an electrostatic attraction is generated between the stage 12 and the substrate W. Due to the generated electrostatic attraction, the substrate W is attracted to the stage 12 and held by the stage 12. In another embodiment, the conductive layer may be a radio-frequency electrode. In this case, a radio-frequency power supply is electrically connected to the conductive layer via a matcher. In yet another embodiment, the conductive layer may be an electrode that is grounded. A conductive layer embedded in such an insulator may also function as a lower electrode for forming an electric field with the upper electrode.

[Dielectric Plate]

In an embodiment, the dielectric plate 18 is disposed under the base 19 of the upper electrode 14 via the space 225 for gas diffusion. The bottom surface of the base 19 has a convex shape in the center and an outer periphery, and is recessed in a ring shape in the middle. In the space 22S for gas diffusion formed under the base 19, the center and the outer periphery are concave along the bottom surface of the base 19, and the middle has a convex shape. The gas from the gas supplier 42 flows in the space 22S. The space 22S for gas diffusion communicates such that the gas diffuses in the horizontal direction.

In an embodiment, a plurality of gas ejection holes 18h are formed in the dielectric plate 18 below the space 22S for gas diffusion. The gas ejection holes 18h are through holes for supplying the gas from the gas supplier 42 to the space SP. Each of the plurality of gas ejection holes 18h penetrates the dielectric plate 18 from the top surface to the bottom surface of the dielectric plate 18. Each of the plurality of gas ejection holes includes an upper hole 18h1 and a lower hole 18h2. The upper hole 18h1 is provided on the top surface side of the dielectric plate 18, and the lower hole 18h2 is provided on the bottom surface side of the dielectric plate 18. The diameter of the upper holes 18h1 is larger than the diameter of the lower holes 18h2.

In each of the plurality of gas ejection holes 18h, the lower hole 18h2 extends to a lower portion of the upper hole 18h1 and communicates with the upper hole 18h1. The upper hole 18h1 communicates with the space 22S. The lower hole 18h2 communicates with the space SP. The plurality of gas ejection holes 18h have large-diameter upper holes 18h1 the lengths of which are adjusted to increase depending on the size of the thickness of the dielectric plate 18 at the portions at which the upper holes 18h1 are formed. In the plurality of gas ejection holes 18h, lengths L1 of the plurality of lower holes 18h2 are substantially the same.

The material of the dielectric plate 18 is ceramic. The material constituting the dielectric plate 18 may include at least one of a group of dielectrics composed of aluminum nitride (AlN), aluminum oxide ($Al_2O_3$), and yttrium oxide ($Y_2O_3$). In the present example, aluminum nitride is used, but other materials may be used as the material of the dielectric plate 18.

A conductor 17 that functions as an upper electrode is provided on the top surface of the dielectric plate 18. A radio-frequency voltage is applied to the conductor 17 between the conductor 17 and the ground potential of the cylindrical member 24 or the like. The material of the conductor 17 is, for example, aluminum, nickel, stainless steel, tungsten, molybdenum, copper, or gold. The conductive film material constituting the conductor 17 may be deposited on the top surface of the dielectric plate 18 by a thermal spraying method, a sputtering method, or a chemical vapor deposition (CVD) method.

A corrosion-resistant film may be formed on at least the bottom surface of the dielectric plate 18 constituting the shower plate. The corrosion-resistant film may include at least one of the group consisting of yttrium oxide film, yttrium oxyfluoride, and yttrium fluoride. Other ceramic materials may also be used for the corrosion-resistant film.

Figure 2:
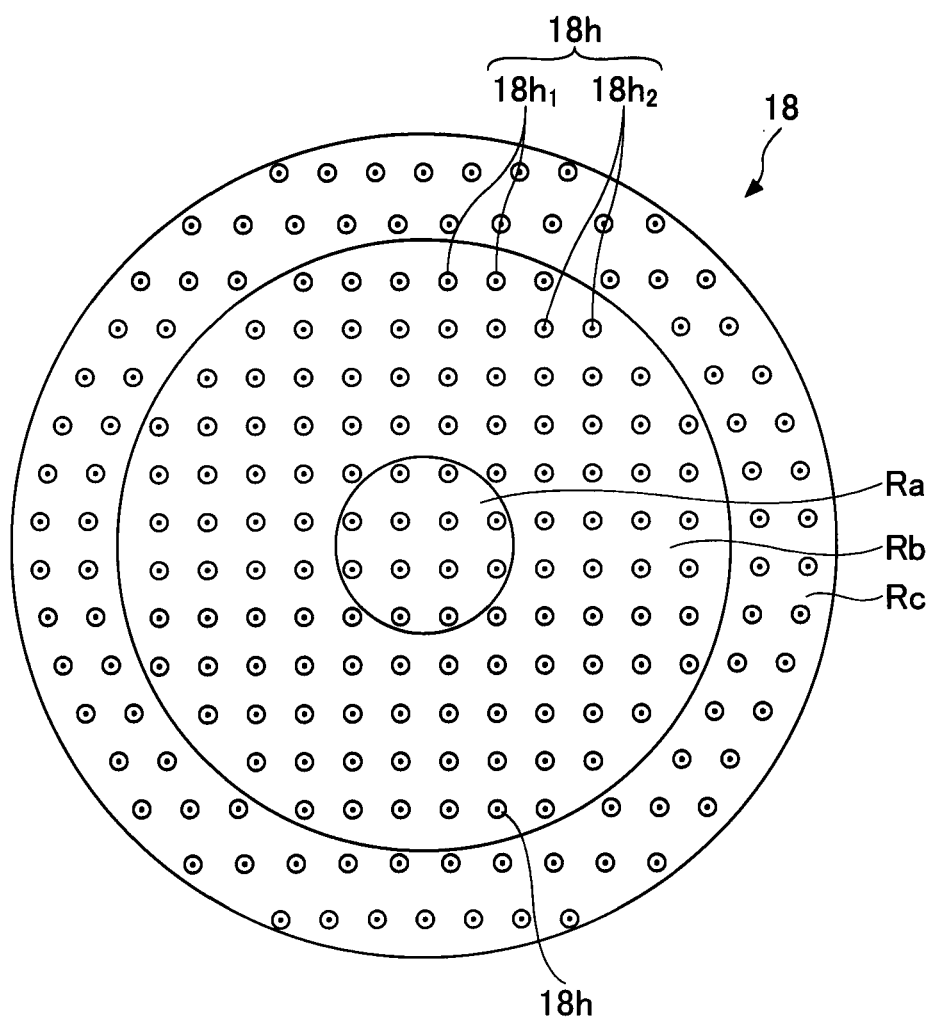
FIG. 2 is a view illustrating a top surface of a dielectric plate according to an embodiment.

FIG. 2 is a view illustrating the top surface of the dielectric plate 18 according to an embodiment. The dielectric plate 18 has three regions, i.e., a central portion Ra, an intermediate portion Rb, and an outer peripheral portion Rc, in a plan view. The intermediate portion Rb is located between the central portion Ra and the outer peripheral portion Rc. That is, the intermediate portion Rb is disposed concentrically to surround the central portion Ra, and the outer peripheral portion Rc is disposed concentrically to surround the intermediate portion Rb.

As illustrated in FIG. 1, the top surface and the bottom surface of the central portion Ra are flat and have a predetermined thickness. The top surface and the bottom surface of the intermediate portion Rb are flat and have a predetermined thickness. The top surface and the bottom surface of the outer peripheral portion Rc are flat and have a predetermined thickness. The thickness of the intermediate portion Rb is larger than the thicknesses of the central portion Ra and the outer peripheral portion Rc. In the embodiment, the thicknesses of the central portion Ra and the outer peripheral portion Rc are the same. However, without being limited to this, the thicknesses of the central portion Ra and the outer peripheral portion Rc may be different from each other.

Due to this configuration, the thickness of the dielectric plate 18 is formed in an approximately inverted-W shape. Specifically, the top surface of the dielectric plate 18 has a level difference in which the central portion Ra and the outer peripheral portion Rc are lower than the intermediate portion Rb. By forming the thickness of the dielectric plate 18 in an approximately inverted-W shape, it is possible to improve the in-plane uniformity of the plasma density. In the embodiment, the level difference between the central portion Ra and the intermediate portion Rb is formed vertically, but is not limited thereto. The level difference may be formed in a stepped shape or may be formed in a gently inclined shape. The level difference between the intermediate portion Rb and the outer peripheral portion Rc is formed vertically, but is not limited thereto. The level difference may be formed in a stepped shape or may be formed in a gently inclined shape.

Figure 3:
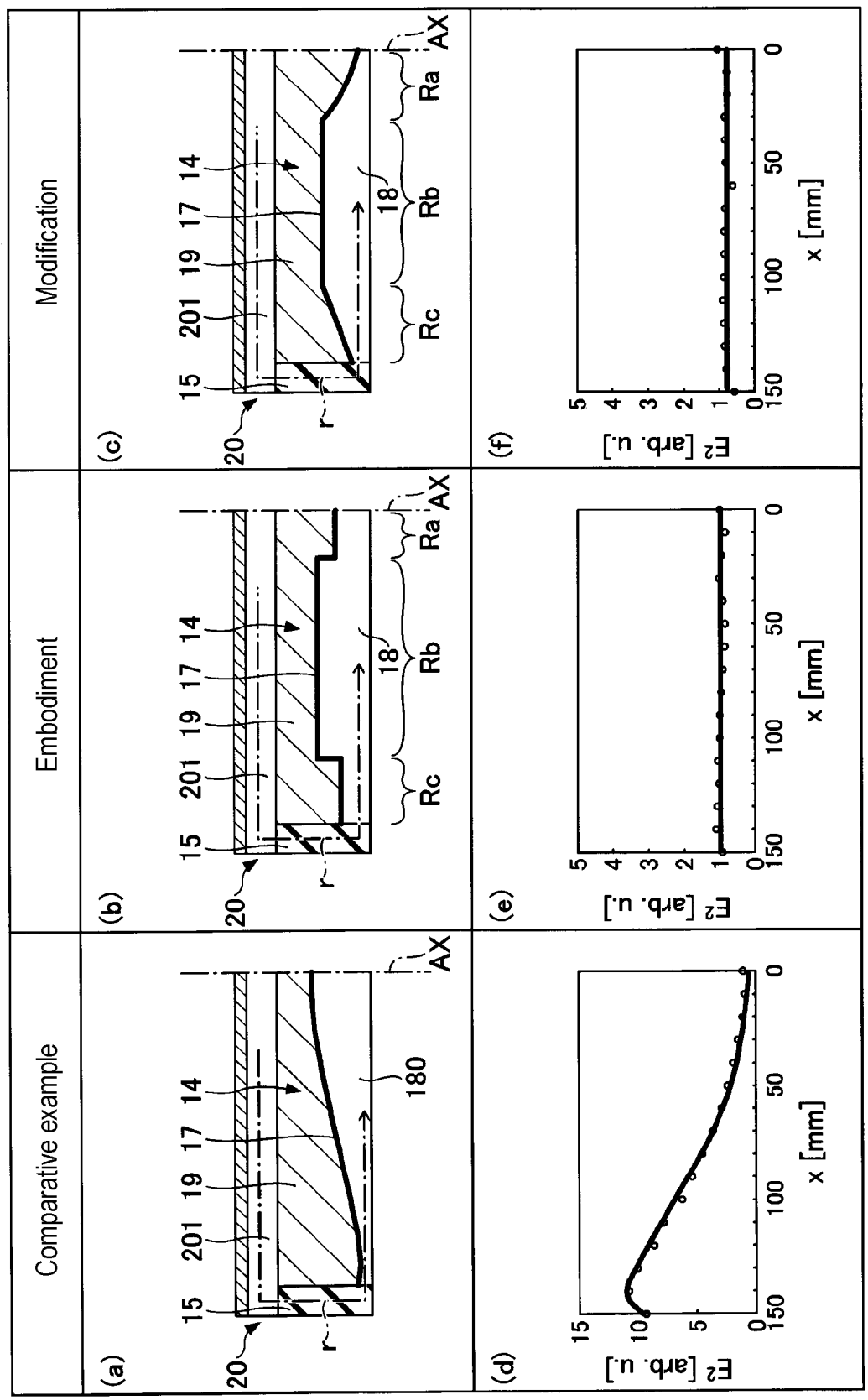
FIG. 3 is a view illustrating dielectric plates and electric field energies $E^2$ of dielectric plates according to an embodiment and a modification thereof in comparison with those of a comparative example.

Each of (a) to (c) of FIG. 3 illustrates a left half of the dielectric plate and an upper electrode 14 and a waveguide part 20 around the dielectric plate, wherein the axis AX is shown as a right end. (a) of FIG. 3 illustrates a dielectric plate 180 according to a comparative example. The top surface of the dielectric plate 180 according to the comparative example has a convex lens shape and has an inclination that gently descends from the center toward the outer periphery. (b) of FIG. 3 illustrates a shape of the dielectric plate 18 according to the embodiment. (c) of FIG. 3 illustrates a shape of the dielectric plate 18 according to a modification of the embodiment.

The dielectric plate 18 according to the embodiment and the modification is capable of improving in-plane uniformity of plasma density compared with the dielectric plate 180 according to the comparative example. Simulation results to prove this and the reasons for this will be described. First, a case where a metal plate is provided on the bottom surface (a plasma forming surface) of the upper electrode 14 (not illustrated) will be described. In this case, the plasma density distribution becomes non-uniform because a high-order mode appears in surface wave plasma propagating on the bottom surface of the metal.

Therefore, in the comparative example, as illustrated in (a) of FIG. 3, a ceramic dielectric plate 180 is provided on the bottom surface of the upper electrode 14 instead of the metal plate. As a result, it is possible to suppress the appearance of a high-order mode in the surface wave plasma propagating on the bottom surface of the dielectric plate 180.

However, although this could improve the uniformity of the plasma density distribution, the improvement did not reach the point where the in-plane uniformity of plasma density could be completely achieved. Each of (d) to (f) of FIG. 3 shows a relationship between a position x (mm) from the center 0 to 150 mm in the radial direction of the dielectric plate 180 or 18 and the electric field energy indicated by $E^2$ (E: electric field). The electric field E is a sheath electric field formed under the dielectric plate 18.

In order to obtain the simulation results of (d) to (f) of FIG. 3, VHF waves were used as a radio-frequency power supply, and radio-frequency waves for plasma generation were applied to the base 19. The diameters of the dielectric plates 18 and the dielectric plate 180 are 300 mm, and the materials thereof are AlN. The thickness of the intermediate portion Rb of the dielectric plate 18 of (b) of FIG. 3 is 2.0 cm, and the thicknesses of the central portion Ra and the outer peripheral portion Rc are 0.5 cm. The conductor 17 was formed by thermal spray of Al. In the comparative example, unlike the embodiment, the thickness of the dielectric plate 180 is 2.0 cm at the center portion and 0.5 mm at the outer peripheral portion, and is gently inclined from the center toward the outer peripheral portion.

As is clear from the graph of (d) of FIG. 3, in the dielectric plate 180 of the comparative example illustrated in (a) of FIG. 3, the value of the electric field energy $E^2$ was higher at the outer peripheral portion and became lower toward the central portion. The electric field energy $E^2$ correlates with the plasma density. The electric field energy $E^2$ is an integrated distribution in the height direction of the electric field energy (between the upper electrode 14 and the stage 12) at a certain position in the radial direction, and this integrated distribution substantially coincides with the plasma density distribution. Therefore, it can be seen that the dielectric plate 180 of the comparative example illustrated in (a) of FIG. 3 has not reached the point at which the plasma density distribution is made uniform.

In contrast, in the dielectric plate 18 according to the embodiment illustrated in (b) of FIG. 3, the thickness is in an approximately inverted-W shape. As a result, as shown in the graph of (e) of FIG. 3, the electric field energy $E^2$ became uniform in the region from the center 0 of the dielectric plate 18 to 150 mm in the radial direction. As a result, it was found that, in the dielectric plate 18 according to the embodiment, the uniformity of the plasma density distribution is achieved above the substrate W having a diameter of 300 mm.

Two reasons will be described as to why the uniformity of plasma density distribution is achieved by making the thickness of the dielectric plate 18 in an approximately inverted-W shape. The first reason is that the density distribution of plasma is determined by the electric field distribution in the plasma. When a metal (conductor) is used instead of the dielectric plate 18, the radio-frequency electric field propagating from the waveguide 15 outside the upper electrode 14 does not reach the center indicated by the axis AX. Therefore, in order to increase the electric field in the central portion, the material of the dielectric plate 18 is made of a dielectric such as ceramic. As a result, radio-frequency waves pass through the interior of the dielectric, and this facilitates the reach of a radio-frequency electric field as a whole.

In addition, by making the thickness of the dielectric plate 18 in an approximately inverted-W shape and flattening the bottom surface, the central portion Ra and the outer peripheral portion Rc are made thinner than the intermediate portion Rb. As a result, the path in the dielectric plate 18 through which radio-frequency waves pass becomes narrower in the central portion Ra and the outer peripheral portion Rc than in the intermediate portion Rb. In order to make radio-frequency waves propagate up to the central portion Ra, the path in the intermediate portion Rb on the way to the central portion Ra is widened to some extent so that the radio-frequency waves can easily pass therethrough.

The thickness of the outer peripheral portion Rc is made smaller than the thickness of the intermediate portion Rb. Since radio-frequency waves propagate from the outer peripheral side toward the center, the electric field tends to be stronger in the outer peripheral portion Rc than in the intermediate portion Rb. Therefore, when the outer peripheral portion Rc and the intermediate portion Rb have the same thickness, it is assumed that an electric field stronger than that in the intermediate portion Rb is generated in the outer peripheral portion Rc, and the propagation of radio-frequency waves is interrupted while the radio-frequency waves are propagating from the outer peripheral portion Rc to the central portion Ra via the intermediate portion Rb so that the radio-frequency waves do not propagate up to the central portion Ra.

Therefore, in order to strengthen a radio-frequency electric field propagating to the central Ra to some extent, recesses are formed in the outer peripheral portion Rc and the central portion Ra of the dielectric plate 18 to narrow the path through which the radio-frequency waves propagate. In the dielectric plate 18 according to the embodiment, the thickness of the outer peripheral portion Rc is made smaller than the thickness of the intermediate portion Rb. As a result, the electric field is weakened in the outer peripheral portion Rc, so that the radio-frequency waves easily propagate from the outer peripheral portion Rc to the intermediate portion Rb. As a result, the radio-frequency waves also easily propagate from the intermediate portion Rb to the central portion Ra, so that the electromagnetic waves can be propagated up to the central portion Ra. Therefore, it is possible to strengthen the radio-frequency electric field in the central portion Ra, and as illustrated in (b) of FIG. 3, the electric field energy $E^2$ becomes uniform in the radial direction of the dielectric plate 18. From the foregoing, by making the thickness of the dielectric plate 18 in an inverted-W shape, it is possible to achieve uniformity in plasma density distribution and to uniformly generate plasma above the substrate W.

The second reason is that by making the thickness of the dielectric plate 18 in an approximately inverted-W shape, it is possible to eliminate a high-order mode of surface wave plasma propagating from the waveguide 15. As a result, it is possible to generate surface wave plasma of a single TM01 mode, to achieve uniformity in plasma density distribution, and to uniformly generate the plasma above the substrate W.

In particular, the plasma processing apparatus 1 according to the embodiment is suitable for generating plasma in a soft diffusion mode in which a substrate W is less damaged, compared to plasma in a coupling mode (a normal CCP), which is more often applied when the apparatus functions as an etching apparatus. That is, the plasma processing apparatus 1 according to the embodiment is suitable when it functions as a film forming apparatus.

Here, the difference between the coupling mode and the diffusion mode will be described. In the coupling mode, the upper electrode 14 and the lower electrode (stage 12) are electrically coupled. In the diffusion mode, the upper electrode 14 and the lower electrode are not electrically coupled. Therefore, in the coupling mode, a strong electric field is generated between the upper electrode 14 and the lower electrode, and in the diffusion mode, a strong electric field is not generated between the upper electrode 14 and the lower electrode. That is, in the diffusion mode, since the electric field on the surface of the substrate W and its vicinity becomes almost 0, there is an advantage in that there is almost no electric field on the surface of the substrate W and damage to the substrate W due to plasma can be suppressed.

For example, the diffusion mode may be defined by a distance G between the upper electrode 14 and the stage 12 and a plasma electron density Ne. For example, the distance G and the plasma electron density Ne are defined as follows. At this time, the frequency of the radio-frequency waves is set to, for example, 180 MHz.

G=60 mm

Ne=5×10$^{10}$ cm$^{-3}$

The values of the distance G and the plasma electron density Ne are not limited to the above example, but when the distance G is sufficiently larger than a skin depth δ, the electric field in the substrate W and its vicinity becomes almost 0, so that the diffusion mode is set. When the plasma electron density Ne is a density generally called high-density plasma, the plasma becomes the diffusion mode. The skin depth δ is a depth from the surface where the current flowing there is attenuated to 1/e (about 0.37 times) with respect to the current flowing on the surface.

The skin depth δ is expressed by Equation 1 below.

[Equation 1]

$$\delta = \sqrt{2/\sigma\mu\omega} \quad (1)$$

σ is the electrical conductivity of a material, μ is the magnetic permeability of the material, and ω is an angular frequency of an alternating current (radio-frequency waves).

The skin depth δ is proportional to the plasma electron density Ne. In an etching apparatus for etching a substrate W, the distance G is, for example, about 5 mm to 30 mm, and the distance between the upper electrode 14 and the lower electrode is short. Therefore, in the etching apparatus, the plasma is in the coupling mode and is generally not the plasma in the diffusion mode.

The plasma in the diffusion mode is suitable for a film forming process performed by a film forming apparatus having a distance G of, for example, 40 mm or more, such as a chemical vapor deposition (CVD) apparatus. For example, the plasma in the diffusion mode is preferably used in a CVD apparatus in which a plasma generation function is added to a thermal CVD apparatus. By using the plasma in the diffusion mode, the effect of the plasma can be utilized in the thermal CVD apparatus while suppressing the damage to the substrate W by the plasma. Thus, it is suitable for film formation of a SiN film and a TEOS film.

As described above, in the plasma processing apparatus 1 according to the embodiment, radio-frequency waves are radiated into the processing container 10 from the exterior of the outermost periphery of the upper electrode 14. In the case of the plasma in the diffusion mode, the upper electrode 14 and the lower electrode are not electrically coupled with each other. Therefore, the radio-frequency waves radiated from the outermost periphery of the upper electrode 14 propagate to the center side of the upper electrode 14 while being reflected by the surface of the plasma. Due to this reflection, the plasma density distribution tends to be high in the peripheral portion of the substrate W and low in the central portion of the substrate W.

In contrast, in the plasma processing apparatus 1 according to the embodiment, the width of the propagation path of radio-frequency waves is adjusted by adjusting the thickness of the dielectric plate 18 such that the thickness is in an approximately inverted-W shape, and as illustrated in (e) of FIG. 3, the in-plane uniformity of plasma density can be achieved by making the radio-frequency electric field (energy) distribution uniform.

[Modification of Dielectric Plate]

The thickness of the dielectric plate 18 according to the modification of the embodiment of (c) of FIG. 3 is in an approximately inverted-W shape, and the central portion Ra and the outer peripheral portion Rc are formed in a slope shape. Even in this case, the central portion Ra and the outer peripheral portion Rc are thinner than the intermediate portion Rb. As a result, the path in the dielectric plate 18 through which radio-frequency waves pass becomes narrower in the central portion Ra and the outer peripheral portion Rc than in the intermediate portion Rb. In order to make radio-frequency waves propagate up to the central portion Ra, the path in the intermediate portion Rb on the way to the central portion Ra is widened to some extent so that the radio-frequency waves can easily pass therethrough. As a result, radio-frequency waves are not interrupted in the course of propagating from the outer peripheral portion Rc to the central portion Ra via the intermediate portion Rb, thereby enabling the radio-frequency waves to propagate up to the central portion Ra. In addition, it is possible to prevent the electric field strength in the outer peripheral portion Rc from becoming higher than the electric field strength in the intermediate portion Rb. As a result, as illustrated in (f) of FIG. 3, the in-plane uniformity of plasma density can be achieved by making the radio-frequency electric field (energy) distribution uniform.

The approximately inverted-W shape, which is the thickness shape of the dielectric plate 18, is preferably a gentle slope shape or a stepped shape. However, it may have some unevenness as long as the thickness is approximately an inverted-W shape. In addition, the bottom surface of the dielectric plate 18 is preferably flat in consideration of the function as a gas shower head, but the bottom surface does not have to be flat.

The level difference of the dielectric plate 18 illustrated in FIG. 1 and (b) of FIG. 3 may be inclined outward. The corner portion of the level difference between the central portion Ra and the intermediate portion Rb may be chamfered and polished to form a rounded shape at the corner portion. Similarly, the corner portion of the level difference between the intermediate portion Rb and the outer peripheral portion Rc may be chamfered and polished to form a rounded shape at the corner portion.

Although there is one level difference between the central portion Ra and the intermediate portion Rb, two or more level differences may exist. Similarly, there is one level difference between the intermediate portion Rb and the outer peripheral portion Rc, but two or more level differences may exist. When the number of level differences is small, there is an advantage in that the number of processes for processing the level difference is decreased, and when the number of level differences is large, there is an advantage in that it is possible to control the electric field difference more precisely.

As illustrated in FIG. 1, the plasma processing apparatus 1 includes a controller 50. The controller 50 is a computer including, for example, a processor, a storage such as memory, an input part, a display, and a signal input/output interface, and controls each part of the plasma processing apparatus 1. A control program and recipe data are stored in the storage. The computer (CPU) executes the control program and controls each part of the plasma processing apparatus 1 according to the recipe data. In addition, the computer controls the radio-frequency power supply 30 and the gas supplier 42 to supply a desired radio-frequency voltage and a gas having a desired gas species and gas flow rate into the processing container 10.

[Plasma Processing Method]

Figure 4:
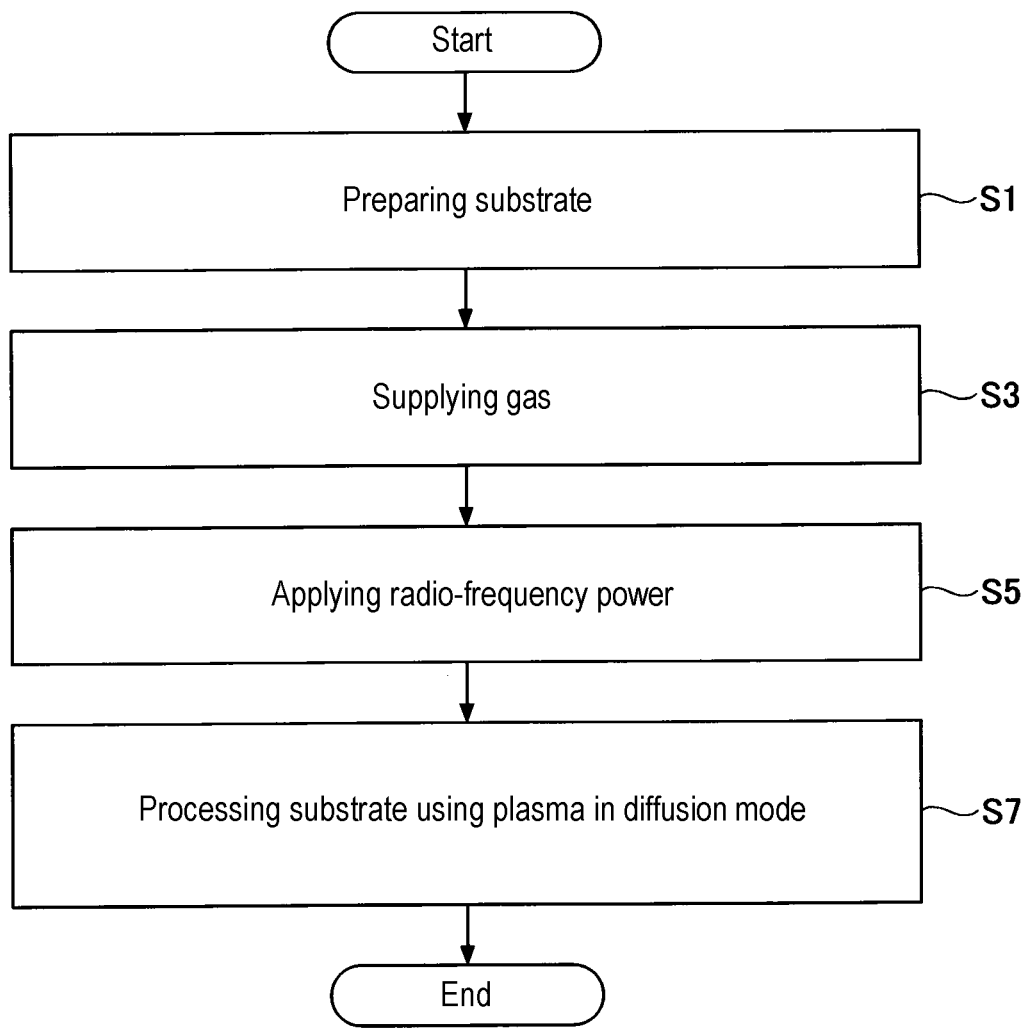
FIG. 4 is a flowchart illustrating a plasma processing method of an embodiment.

Next, the plasma processing method according to an embodiment will be described with reference to FIG. 4. FIG. 4 is a flowchart illustrating the plasma processing method of the embodiment. This process is controlled by the controller 50.

When this process is started, in step S1, the controller 50 prepares a substrate W by opening a gate valve (not illustrates), carrying the substrate W into the processing container 10, and placing the substrate W on the stage 12.

Next, in step S3, the controller 50 supplies a desired gas from the gas supplier 42 into the processing container 10 via the pipe 40. Next, in step S5, the controller 50 applies radio-frequency power to the base 19 (to propagate to and from the ground). As a result, plasma in the diffusion mode is generated from the gas in the processing container 10 by radio-frequency energy. For example, when the distance G between the electrodes illustrated in FIG. 1 is 60 mm, the upper electrode 14 and the lower electrode are not electrically coupled with each other, and plasma in the diffusion mode is generated.

Next, in step S7, the controller 50 causes the substrate W to be processed with the plasma in the diffusion mode. In the present embodiment, it is possible to generate uniform plasma by forming the thickness of the dielectric plate 18 in an approximately inverted-W shape. As a result, it is possible to perform a plasma process uniformly in the plane of the substrate W. The substrate W processing differs depending on the type of gas introduced into the processing container 10. When the gas is an etching gas, the surface of the substrate is etched, and when the gas is a gas for film formation, a film is formed on the surface of the substrate depending on the gas species.

[Modification of Plasma Processing Apparatus]

Figure 5:
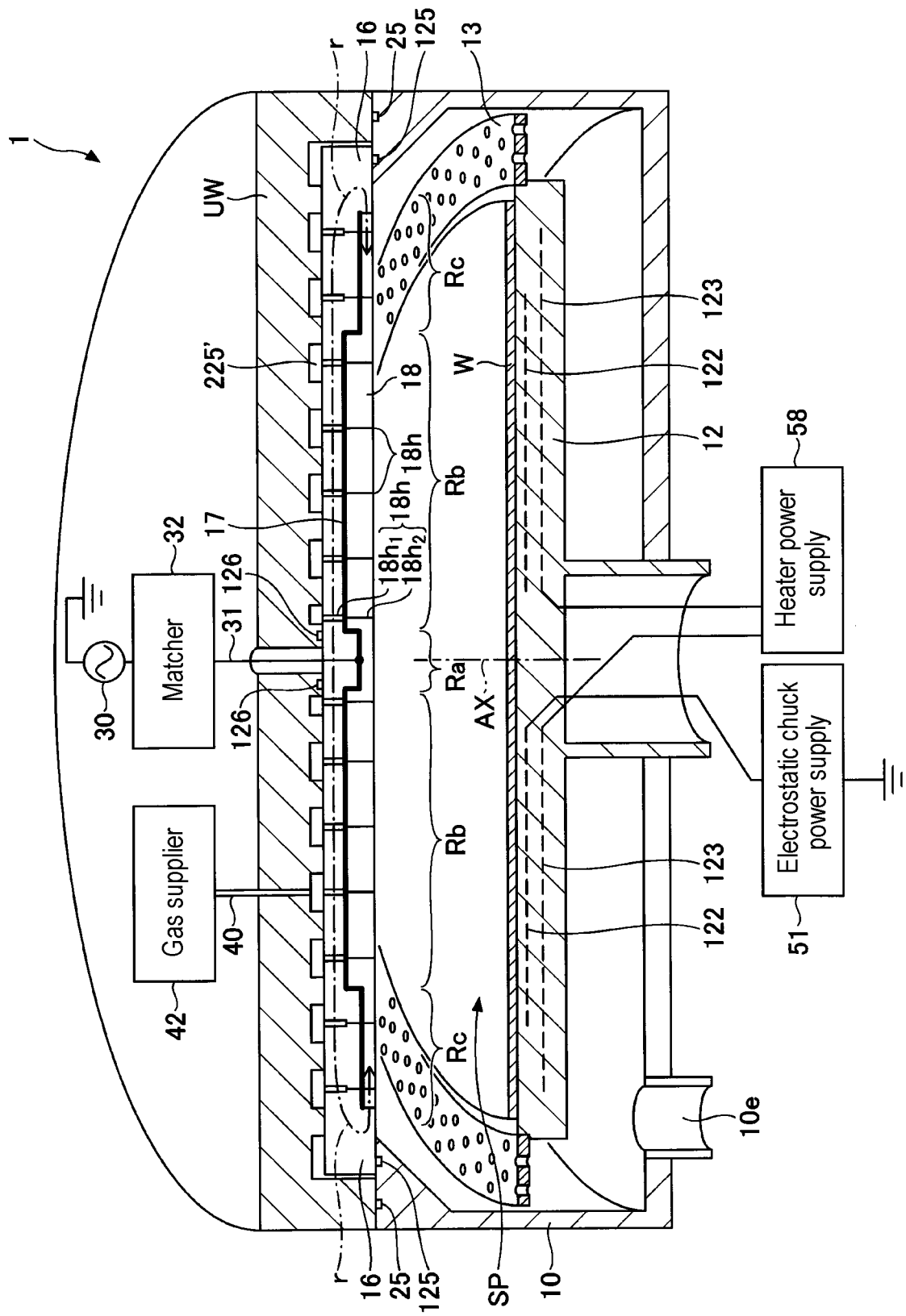
FIG. 5 is a schematic cross-sectional view illustrating a plasma processing apparatus according to a modification of the embodiment.

Next, a modification of the plasma processing apparatus 1 according to the embodiment will be described with reference to FIG. 5. FIG. 5 is a schematic cross-sectional view illustrating the plasma processing apparatus 1 according to a modification of the embodiment. The plasma processing apparatus 1 according to the modification includes a processing container 10, a stage 12, a dielectric plate 18, a conductor 17, and an introduction part 16. The conductor 17 is a metal mesh or a metal thin film. In the present example, the conductor 17 is a metal mesh, and the material thereof is tungsten or molybdenum, but other conductive materials may be used.

The processing container 10 has a substantially cylindrical shape and extends along the vertical direction. The central axis of the processing container 10 is an axis AX extending in the vertical direction. The description of the processing container 10, the stage 12, the baffle member 13, and the exhaust port 10e is the same as that made with reference to FIG. 1, and is therefore omitted.

A dielectric plate 18 is arranged in the upper wall UW of the processing container 10 via a space 225' for gas diffusion. The upper wall UW has ground potential. A convex portion of the bottom surface of the upper wall UW is in contact with the top surface of the dielectric plate 18. The bottom surface of the upper wall UW has an uneven structure, and the gas from the gas supplier 42 flows through the space 225' in a recess. The pipe 40 is connected to the space 225' in the recess.

The dielectric plate 18 has a substantially disk-like shape. The central axis of the upper electrode 18 substantially coincides with the axis AX. The conductor 17 is embedded in the ceramic dielectric plate 18 from a sintering step. Radio-frequency power is applied to the conductor 17 from the radio-frequency power supply 30 via the matcher 32. A sealing member 126 is interposed between the bottom surface of the upper wall UW and the top surface of the dielectric plate 18 near a feeding line 31. A sealing member 125 is interposed between the bottom surface of the upper wall UW and the top surface of the dielectric plate 18 on the outer peripheral side, and a sealing member 25 is interposed between the bottom surface of the upper wall UW and the top surface of the processing container 10.

Below the space 225', gas ejection holes 18h in the dielectric plate 18 are located. Each of gas ejection holes 18h includes an upper hole 18h1 located in the upper portion thereof and a lower hole 18h2 located in the lower portion thereof. The inner diameter of the upper hole 18h1 is larger than the inner diameter of the lower hole 18h2, and the upper and lower holes communicate with each other. The gas diffused in the space 225' for gas diffusion is introduced into the lower hole 18h2 having an inner diameter smaller than that of the upper hole 18h1, and is ejected to the space SP. With this structure, the flow velocity at the time of ejection is regulated by the diameter of the lower hole 18h2, and the flow velocity of the gas is adjustable.

The dielectric plate 18 and the conductor 17 are made of a material having high heat resistance. Since the conductor 17 has a thin film shape or a mesh shape, thermal stress at a high temperature is small even if the coefficient of thermal expansion of the conductor is different from that of the dielectric. Since the conductor 17 is covered with the dielectric plate 18, the conductor is not corroded even at a high temperature. Therefore, it is possible to use the dielectric plate 18 at a high temperature (e.g., 300 to 600 degrees C.). By setting the temperature of the dielectric plate 18 high when performing a plasma process, it is possible to suppress the adhesion of reaction products to the surface of the dielectric plate 18.

A corrosion-resistant film may be formed on at least a bottom surface among the surfaces of the dielectric plate 18 constituting the shower plate. The corrosion-resistant film may be an yttrium oxide film, an yttrium oxyfluoride film, an yttrium fluoride film, or a ceramic film containing yttrium oxide, yttrium fluoride, or the like.

In the plasma processing apparatus 1, radio-frequency waves are output from the radio-frequency power supply 30, propagate through the waveguide path r above the conductor 17 of the dielectric plate 18, propagate from the introduction portion 16 to the outer peripheral side of the dielectric plate 18, and pass through the dielectric plate 18. That is, the radio-frequency waves are supplied from the bottom surface of the dielectric plate 18 to the space SP while propagating from the introduction portion 16 through the dielectric plate 18 under the conductor 17 in the order of the outer peripheral portion Rc, the intermediate portion Rb, and the central portion Ra. As a result, a radio-frequency electric field is introduced from the bottom surface of the dielectric plate 18 into the space SP to generate surface wave plasma in the vicinity of the bottom surface of the dielectric plate 18. The radio-frequency waves are VHF waves. The radio-frequency waves may be UHF waves.

The stage 12 further includes a conductive layer 123. The distance between the conductive layer 123 and the top surface of the stage 12 is larger than the distance between the conductive layer 122 and the top surface of the stage 12. The conductive layer 123 is a heater. In an embodiment, the conductive layer 123 is connected to a heater power supply 58. The conductive layer 122 is connected to an electrostatic chuck power supply 51.

Even in the plasma processing apparatus 1 according to the modification, the unevenness of the dielectric plate 18 and the conductor 17 is adjusted to form a substantially W shape, thereby adjusting the width of the passage of the radio-frequency electric field. As a result, even when the radio-frequency waves propagate through the outer peripheral portion Rc→the intermediate portion Rb→the central portion Ra of the dielectric plate 18, the electric field distribution due to the radio-frequency waves can be made uniform as in the case of the embodiment. This makes it possible to achieve in-plane uniformity of plasma density.

The thickness of the dielectric plate 18 is in an approximately inverted-W shape (the outer peripheral portion is thin, the intermediate portion is thick, and the central portion is thin). This makes it possible to form electric fields by radio-frequency waves uniformly in the space SP. The radio-frequency electric fields formed in the space SP excite the gas in the space SP, and plasma is generated from the gas. As a result, the plasma is generated with a uniform density distribution in the space SP. The substrate W on the stage 12 is processed with chemical species from the plasma.

In the plasma processing apparatus 1 according to the embodiment of FIG. 1 and the plasma processing apparatus 1 according to the modification of FIG. 5, a corrosion-resistant film is formed on at least the bottom surface among the surfaces of the dielectric plate 18. The corrosion-resistant film may be an yttrium oxide film, an yttrium oxyfluoride film, an yttrium fluoride film, or a ceramic film containing yttrium oxide, yttrium fluoride, or the like.

The plasma processing apparatuses 1 illustrated in FIGS. 1 and 5 may have two layers of conductors 17 embedded in the top surface and/or inside the dielectric plate 18, rather than one layer. In this case, the conductor 17 located above is connected to the ground potential and is grounded. The conductor 17 located below is connected to the radio-frequency power supply 30 via the matcher 32.

It should be understood that the plasma processing apparatus and the plasma processing method according to the embodiments disclosed herein are illustrative in all aspect and not restrictive. The above-described embodiments may be modified and improved in various forms without departing from the scope and spirit of the appended claims. The matters described in the above embodiments may also take other configurations to the extent they are not contradictory, and may be combined to the extent they are not contradictory.

The present international application claims priority based on Japanese Patent Application No. 2019-220668 filed on Dec. 5, 2019, the disclosure of which is incorporated herein in its entirety by reference.

EXPLANATION OF REFERENCE NUMERALS

1: plasma processing apparatus, 10: processing container, 10e: exhaust port, 12: stage, 13: baffle member, 14: upper electrode, 15, 201: waveguide, 17: conductor, 18: dielectric plate, 18h: gas ejection hole, 19: base (conductor), 20: waveguide part, 30: radio-frequency power supply, 32: matcher, 40: pipe, 42: gas supplier, 50: controller, r: waveguide passage, SP: space, W: substrate

What is claimed is:

1. A plasma processing apparatus comprising:
a stage provided in a processing container; and
an upper electrode,
wherein the upper electrode includes:
a dielectric plate facing the stage, and
a conductor formed on a surface of the dielectric plate opposite to a surface of the dielectric plate facing the stage,
wherein the dielectric plate includes a central portion, an outer peripheral portion, and an intermediate portion between the central portion and the outer peripheral portion,
wherein the intermediate portion has a thickness larger than thicknesses of the central portion and the outer peripheral portion to form the dielectric plate in an inverted-W shape, and
wherein the central portion, the outer peripheral portion and the intermediate portion are positioned directly above the substrate placed on the stage.

2. The plasma processing apparatus of claim 1, wherein a level difference on a top surface of the dielectric plate is formed in a stepped shape.

3. The plasma processing apparatus of claim 2, wherein top surfaces of the central portion, the intermediate portion, and the outer peripheral portion are flat.

4. The plasma processing apparatus of claim 3, wherein thicknesses of the central portion and the outer peripheral portion are equal to each other.

5. The plasma processing apparatus of claim 4, wherein the conductor is a metal mesh or a metal film.

6. The plasma processing apparatus of claim 5, wherein the dielectric plate includes a plurality of through holes for gas supply.

7. The plasma processing apparatus of claim 6, wherein the upper electrode is configured to apply radio-frequency power from a surface of the upper electrode opposite to the dielectric plate with the conductor interposed between the upper electrode and the dielectric plate.

8. The plasma processing apparatus of claim 1, wherein a top surface of the dielectric plate is formed in a slope shape.

9. The plasma processing apparatus of claim 1, wherein top surfaces of the central portion, the intermediate portion, and the outer peripheral portion are flat.

10. The plasma processing apparatus of claim 1, wherein thicknesses of the central portion and the outer peripheral portion are equal to each other.

11. The plasma processing apparatus of claim 1, wherein thicknesses of the central portion and the outer peripheral portion are different from each other.

12. The plasma processing apparatus of claim 1, wherein the conductor is a metal mesh or a metal film.

13. The plasma processing apparatus of claim 1, wherein the dielectric plate includes a plurality of through holes for gas supply.

14. The plasma processing apparatus of claim 1, wherein the upper electrode further includes a base provided on an opposite side to the dielectric plate with the conductor interposed between the dielectric plate and the base, and is configured to apply radio-frequency power from the base.

15. A plasma processing method using the plasma processing apparatus of claim 1, the plasma processing method comprising:
preparing the substrate on the stage;
supplying a gas into the processing container; and
applying radio-frequency power from the upper electrode, generating plasma from the gas, and processing the substrate.

* * * * *